United States Patent
Broutin et al.

(10) Patent No.: US 6,400,737 B1
(45) Date of Patent: Jun. 4, 2002

(54) AUTOMATIC CLOSED-LOOPED GAIN ADJUSTMENT FOR A TEMPERATURE TUNED, WAVELENGTH STABILIZED LASER SOURCE IN A CLOSED-LOOP FEEDBACK CONTROL SYSTEM

(75) Inventors: Scott L. Broutin, Kutztown; John W. Stayt, Jr., Schnecksville, both of PA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/459,981

(22) Filed: Dec. 14, 1999

(51) Int. Cl.[7] .................................................. H01S 3/10
(52) U.S. Cl. ............................. 372/20; 372/32; 372/34
(58) Field of Search ............................... 372/20, 32, 34

(56) References Cited

U.S. PATENT DOCUMENTS

| | | | |
|---|---|---|---|
| 4,914,648 A | | 4/1990 | Acampora et al. |
| 4,947,398 A | * | 8/1990 | Yasuda .................. 372/29.021 |
| 5,107,511 A | | 4/1992 | Nakatani et al. |
| 5,144,632 A | * | 9/1992 | Thonn .......................... 372/33 |
| 5,214,527 A | | 5/1993 | Chang et al. |
| 5,706,301 A | * | 1/1998 | Lagerstrom .................. 372/32 |
| 5,774,243 A | | 6/1998 | Majima |
| 5,825,792 A | | 10/1998 | Villeneuve et al. |
| 5,832,014 A | | 11/1998 | Johnson |
| 6,122,301 A | * | 9/2000 | Tei ............................... 372/32 |
| 6,236,667 B1 | * | 5/2001 | Broutin ........................ 372/32 |
| 6,243,403 B1 | * | 6/2001 | Broutin ........................ 372/32 |
| 6,291,813 B1 | * | 9/2001 | Ackerman .............. 250/214 R |

* cited by examiner

Primary Examiner—James W. Davie
Assistant Examiner—Gioacchino Inzirillo
(74) Attorney, Agent, or Firm—Dickstein Shapiro Morin & Oshinsky LLP

(57) ABSTRACT

A closed-loop feedback control system with a temperature tuned, wavelength stabilized laser module. The system uses a feedback control signal dependent upon a predetermined gain to control the temperature of the laser module. The laser module has an output connected to a controller via filtering and reference circuitry. The controller inputs etalon and reference signals from the filtering and reference circuitry to monitor the optical amplitude and wavelength of the laser module output, as well as the temperature of the laser module. When the controller detects a change in a slope of the etalon signal, the controller calculates a new numeric gain based on the changed slope. The new numeric gain and temperature of the laser module is used to generate a new control signal to maintain the output of the laser module at a desired wavelength. By monitoring the slope of the etalon signals, the system is capable of performing automatic closed-loop gain adjustment. As such, the system prevents strong oscillations of the control signal about a desired wavelength locking point, wavelength drift beyond system specifications and unwanted mode-hopping of the laser wavelength to undesired channels.

46 Claims, 4 Drawing Sheets

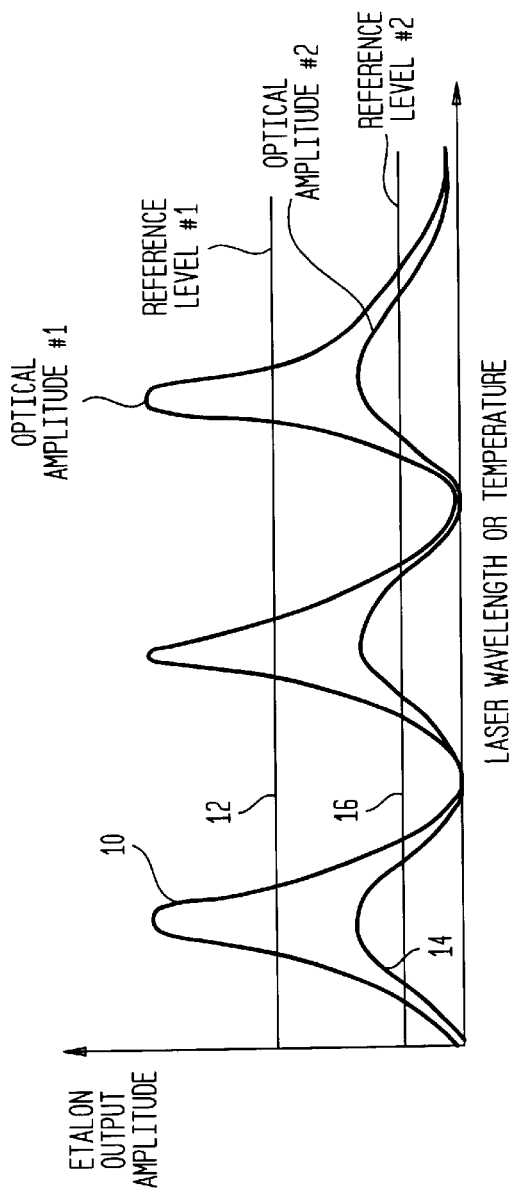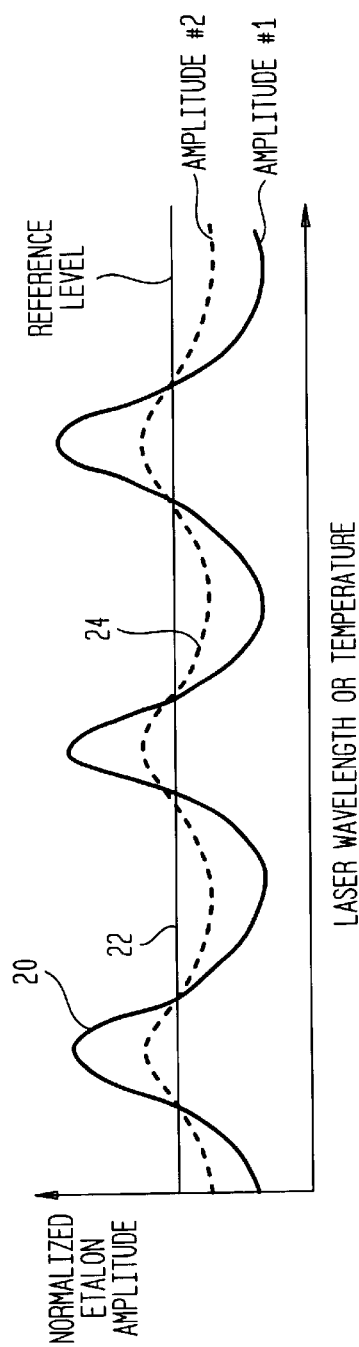

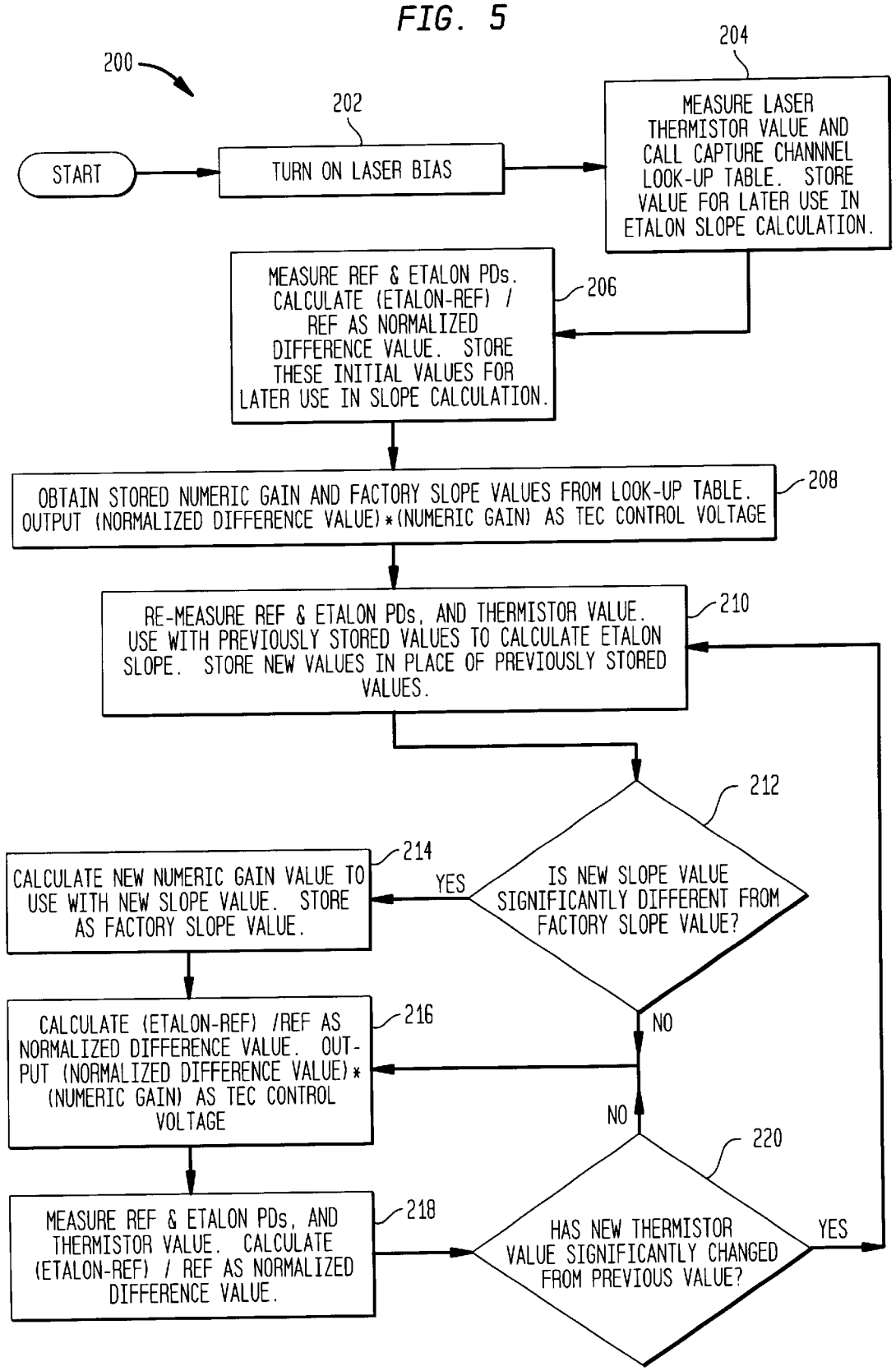

AUTOMATIC CLOSED-LOOPED GAIN ADJUSTMENT FOR A TEMPERATURE TUNED, WAVELENGTH STABILIZED LASER SOURCE IN A CLOSED-LOOP FEEDBACK CONTROL SYSTEM

BACKGROUND OF THE INVENTION

1. Field of the Invention

The present invention relates generally to tunable lasers and other tunable optical signal sources and, more particularly, to a method and apparatus for automatic closed-loop gain adjustment in a closed-loop control system containing a temperature tuned, wavelength stabilized laser source or other tunable optical signal source.

2. Description of the Related Art

Optical fiber communications systems provide for low loss and very high information carrying capacity. In practice, the bandwidth of optical fiber may be utilized by transmitting many distinct channels simultaneously using different carrier wavelengths. The wavelengths of the various channels used in communication systems have been standardized by the International Telecommunications Union (ITU) grid. The ITU grid includes frequencies from approximately 191,900 GHz to 195,800 GHz with a separate channel occurring approximately every 100 GHz. The associated technology is called wavelength division multiplexing (WDM). Dense WDM, or DWDM, systems incorporate 25 or 50 GHz channel separation.

The wavelength bandwidth that any individual channel occupies depends on a number of factors, including the impressed information bandwidth, and margins to accommodate carrier frequency drift, carrier frequency uncertainty, and to reduce possible inter-channel cross-talk due to non-ideal filters.

To maximize the number of channels, lasers with stable and precise wavelength control are required to provide narrowly spaced, multiple wavelengths. Various approaches have been used to limit the oscillation of a laser to one of the competing longitudinal modes. One approach is a distributed feedback mechanism. Distributed-feedback (DFB) lasers are the most common type of communications laser. A grating integral to the laser structure limits the output to a single frequency. Another of the most common methods is temperature tuning, which requires the use of a frequency selective external cavity/etalon in combination with such a laser device to detect the output wavelength, based on the etalon's response curve, at which the laser is operating. The laser frequency can be determined based on the normalized etalon output and adjusted accordingly by varying the temperature of the laser. Such a method allows for wavelength locking of a laser even in the event of changing ambient temperature conditions.

Etalon based wavelength stabilized laser sources are rapidly becoming preferred within the optics field. Systems incorporating an etalon based wavelength stabilized laser source typically use a feedback loop to vary the temperature of the laser (based on the normalized etalon output) and are sometimes referred to as closed-loop feedback control systems. These systems typically have a life of 25 years.

Typical closed-loop feedback systems feed back a control signal to adjust the temperature of the laser after variations in the wavelength of the laser optical output has been detected. As noted above, these systems use an etalon output and a reference output to determine the wavelength of the laser output. The etalon output is dependent upon the optical amplitude and wavelength of the laser output. On the other hand, the reference output is dependent solely on optical amplitude. Changes in the optical amplitude of the laser output entering the etalon filter creates changes in the periodic slope values of the etalon response curve. The changes in the periodic slope occur even though the etalon response curve will retain its general shape and periodicity as a function of wavelength. This is typically not a problem after the output has been normalized to a reference signal because under normal circumstances, after normalization, a change in optical power alone will not produce a change in slope for the same laser. However, if an external physical mechanism has altered the response characteristics of the etalon, a change in slope may occur, even after normalization. This change in slope may be a problem (described below).

FIG. 1 illustrates two exemplary etalon response curves 10, 14, each representing etalon outputs that have been converted into electrical signals from optical signals, and their respective reference outputs 12, 16. FIG. 1 illustrates two etalon curves 10, 14 that have been generated from two separate laser outputs into the same etalon filter, each laser output having a different optical amplitude. The two etalon curves 10, 14 are illustrated in the same graph for comparison purposes only. Although the curves 10, 14 have different optical amplitudes, they both retained their general shape and periodicity as a function of laser wavelength (and temperature as will be described below).

Each reference output 12, 16 has an associated reference amplitude level. In determining the wavelength of the laser output, the etalon curves 10, 14 are normalized with respect to their respective reference outputs 12, 16. FIG. 2 illustrates normalized etalon curves 20, 24 and a reference output 22. Again, FIG. 2 illustrates two normalized etalon response curves 20, 24 for comparison purposes only. As known in the art, a normalized etalon output, e.g., curve 20, is used to calculate the control signal used to control the temperature of the laser. Some gain value must be applied to properly adjust the feedback control signal relative to the amount of change that has occurred in the etalon output. The actual gain value used is system dependent and is usually determined and stored when the system is initially calibrated. After the system is calibrated, and the gain value is determined, the gain value is not adjusted.

It is known that the value of the gain used to generate the control signal is dependent solely upon the slope of the etalon response curve when the change in the etalon response has occurred. If the system is properly calibrated, the slopes of the system will be known, gain values can be set accordingly and used to generate proper feedback control signals. Unfortunately, these slopes may unexpectedly change after the system is calibrated. Possible causes for the changing slopes include, but are not limited to, aging or changes in the optical coatings on the etalon filter or a change in the alignment of device optics within the laser. These unexpected and unaccounted for increases or decreases in the etalon response curve slopes, without an adjustment of the closed-loop gain of the system, may result in strong oscillations of the control signal about the desired wavelength locking point. This can also cause the system to respond to changes in laser wavelength too slowly; thus, risking wavelength drift beyond the system specifications. This may even cause mode-hopping of the laser wavelength to an entirely different channel.

Current systems use power control circuitry to re-adjust the optical power of the laser to a known constant output value when there is a change in optical output power.

Unfortunately, the power control/recovery loop may not respond within the time necessary to prevent the above-mentioned problems. This is due in part because the temperature control loop is constantly engaged and reacting at a very fast speed relative to the power control loop. There is another problem with these systems. That is, in some of the devices, such as the distributed Bragg Reflector (DBR) laser, the power control loop does not make use of the optical signal being output from the backface of the laser (often referred to as the "backface output"), which is the signal typically used to control wavelength locking. Instead, these systems will vary an amplifier or other device from the front face of the laser (i.e., the main laser output that does not pass through an etalon filter). As such, the etalon will not see the power recovery. Accordingly, there is a desire and need for automatic closed-loop gain adjustment in a closed-loop feedback control system containing a temperature tuned, wavelength stabilized laser source or other tunable optical signal source.

SUMMARY OF THE INVENTION

The present invention provides a method and apparatus for automatic closed-loop gain adjustment in a closed-loop feedback control system containing a temperature tuned, wavelength stabilized laser source or other tunable optical signal source.

The above and other features and advantages of the invention are achieved by providing a closed-loop feedback control system with a temperature tuned, wavelength stabilized laser module. The system uses a feedback control signal dependent upon a predetermined gain to control the temperature of the laser module. The laser module has an output connected to a controller via filtering and reference circuitry. The controller inputs etalon and reference signals from the filtering and reference circuitry to monitor the optical amplitude and wavelength of the laser module output, as well as the temperature of the laser module. When the controller detects a change in a slope of the etalon signal, the controller calculates a new numeric gain based on the changed slope. The new numeric gain and temperature of the laser module is used to generate a new control signal to maintain the output of the laser module at a desired wavelength. By monitoring the slope of the etalon signals, the system is capable of performing automatic closed-loop gain adjustment. As such, the system prevents strong oscillations of the control signal about a desired wavelength locking point, wavelength drift beyond system specifications and unwanted mode-hopping of the laser wavelength to undesired channels.

BRIEF DESCRIPTION OF THE DRAWINGS

The foregoing and other advantages and features of the invention will become more apparent from the detailed description of the preferred embodiments of the invention given below with reference to the accompanying drawings in which:

FIG. 1 illustrates exemplary etalon response curves and their respective references;

FIG. 2 illustrates exemplary normalized etalon response curves;

FIG. 5 illustrates in flow chart form an exemplary automatic closed-loop gain adjustment method used in the system of FIG. 4.

DETAILED DESCRIPTION OF PREFERRED EMBODIMENTS

Figure 4:
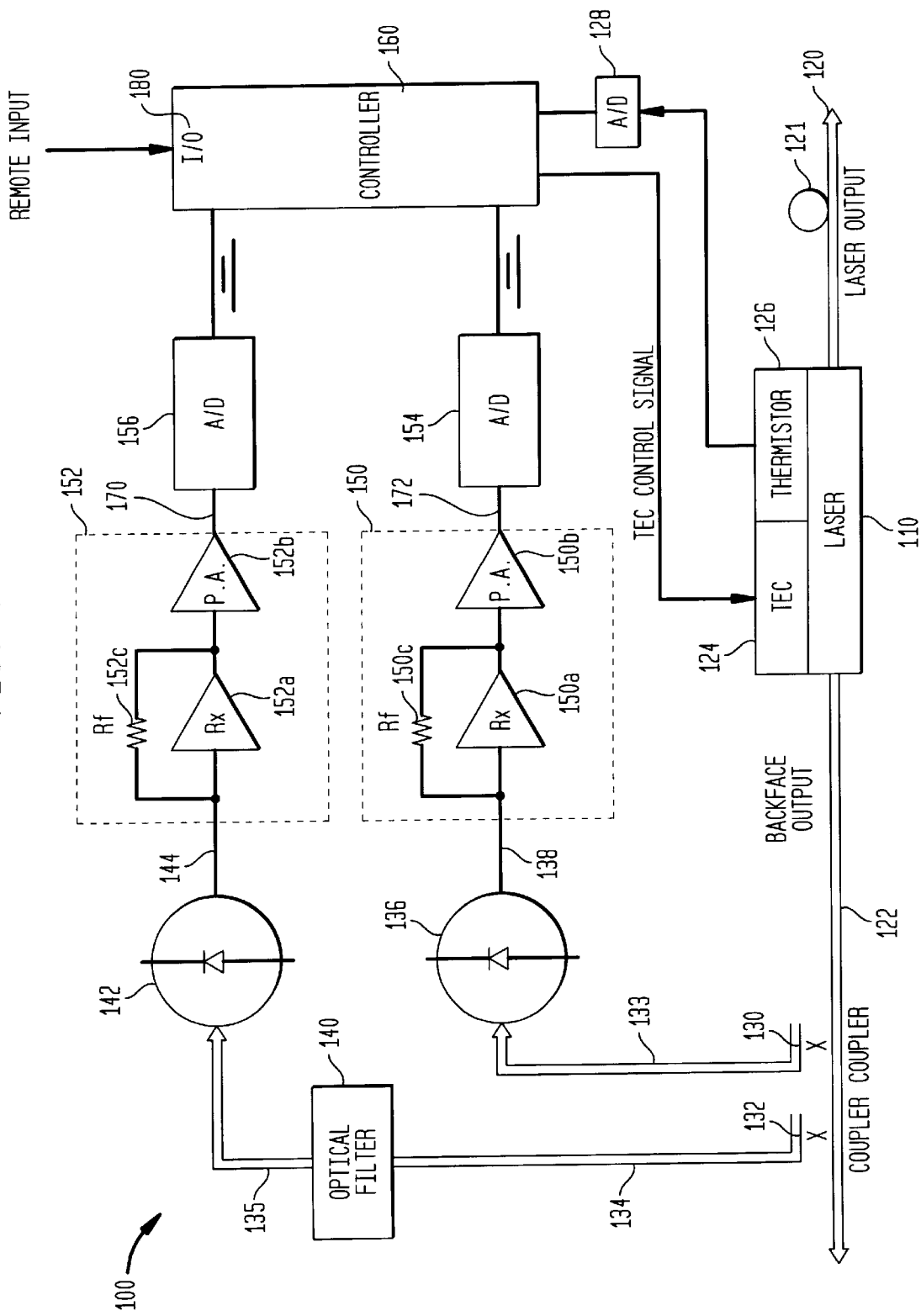
FIG. 4 illustrates a closed-loop feedback control system constructed in accordance with an embodiment of the present invention.

FIG. 4 illustrates in block diagram form a portion of a typical closed-loop feedback control system 100 More specifically, FIG. 4 illustrates a system 100 for controlling a temperature tuned, wavelength stabilized laser module 110. When the system 100 executes the method 200 (FIG. 5) of the present invention, it will perform automatic closed-loop gain adjustment to compensate for changes in the etalon response curve slopes of the system 100. In doing so, the system 100 prevents strong oscillations of a control signal used to control the module 110 about a desired wavelength locking point. The system will also prevent wavelength drift beyond system specifications and unwanted mode-hopping of the wavelength to undesired channels.

The system 100 includes a laser module 110. The laser module 110 can be a DBR type laser or any other conventional laser. The laser module 110 is mounted to a Thermo-Electric Cooler (TEC) 124. A submount (not shown) between the laser module 110 and the TEC 124 can be used for thermal expansion matching if so desired. As noted above, the module 110 is temperature tunable. As known in the art for temperature tuned lasers, the output of laser module 110 can be adjusted by modifying its temperature. The temperature of laser module 110 can be adjusted by varying the temperature of TEC 124. A thermistor 126 is used to monitor the temperature of the module 110. A reading from the thermistor 126 is input into a controller 160 via an analog-to-digital converter 128. The temperature of TEC 124 is varied based on a TEC control signal from the controller 160 through a digital to analog (D/A) output of the controller (not shown).

Controller 160 may include a programmable logic device, one example being a microprocessor. If a microprocessor is used, it may be any conventional general purpose single- or multi-chip microprocessor, or may be any conventional special purpose microprocessor such as a digital signal processor. It should be appreciated that D/A and A/D converters external to the controller 160 can be used to convert any output or input of the controller 160 and the invention is not to be limited to a controller 160 having internal D/A and A/D conversion capabilities.

Controller 160 monitors and controls the output of the laser module 110 as will be discussed below. The module 110 generates a laser output 120 and a backface output 122. A lens 121 may be provided to focus the laser output 120. The laser output 120 is transmitted over an optical link, such as a fiber optic cable (not shown).

The backface output 122 is split by two couplers 130, 132 to form first and second backface optical signals 133, 134. The first backface optical signal 133 is input to a first photodetector 136 to convert the signal 133 (which is an optical signal) into an electrical signal 138 (hereinafter referred to as the "reference photodiode output 138"). The reference photodiode output 138 is input to a first photodiode amplifier circuit 150, which may include for example, operational amplifiers 150a, 150b and feedback resistor 150c, to form a reference signal 172. The reference signal 172 is input into controller 160 via an analog to digital (A/D) converter 154. The first photodiode 136, reference photodiode output 138, reference signal 172 and the first amplifier circuit 150 form a conventional "reference path" used by the controller 160 during automatic closed-loop gain adjustment of the present invention as well as wavelength stabilization and channel selection.

The second backface optical signal 134 is input to an optical filter 140, such as an etalon filter. The output 135 from the filter 140 is input to the second photodetector 142 to convert the signal 134 (which is an optical signal) into an electrical signal 144 (hereinafter referred to as the "etalon photodiode output 144"). The etalon photodiode output 144 is input into a second photodiode amplifier circuit 152, which may include for example operational amplifiers 152a, 152b and feedback resistor 152c, to form an etalon signal 170. The etalon signal 170 is input into the controller 160 via a third A/D converter 156. The filter 140, second photodiode 142, etalon photodiode output 144, etalon signal 170 and the second amplifier circuit 152 form a conventional "etalon path" used by the controller in conjunction with the reference path during automatic closed-loop gain adjustment of the present invention as well as wavelength stabilization and channel selection. The etalon path in conjunction with the reference path form what is commonly known as a wavelength stabilization system.

The controller 160 has an input/output (I/O) terminal 180 and is responsive to remote inputs, which may include a user interface to allow a user to change wavelengths or "tweak" operations of the system 100. A user interface would also allow a user to monitor operational parameters of the system 100. The controller 160 is capable of loading therein a computer software program via the I/O terminal 180. The I/O terminal 180 can be a serial port, universal bus or any other terminal or interface capable of inputting the instructions and data portions of a computer software program including an Ethernet or other network port. The controller 160 contains non-volatile and volatile memory required to store and run an input software or firmware program. It is desirable that non-volatile memory be used to store the program and any data required by the program so that the system 100 can operate in a stand alone mode. It is also desirable that the controller 160 contain volatile memory to be used as temporary storage while the program is executing. It should be appreciated that the exact architecture of the controller 160 is not important as long as the controller 160 can execute the method 200 of the present invention (FIG. 5).

FIG. 5 illustrates an exemplary method 200 for performing automatic closed-loop gain adjustment in the system 100 (FIG. 4). Prior to discussing the method 200, the following description is provided to show the relationships between the TEC control signal, laser temperature, etalon slopes and numeric gain for the closed-loop system 100.

Figure 3:
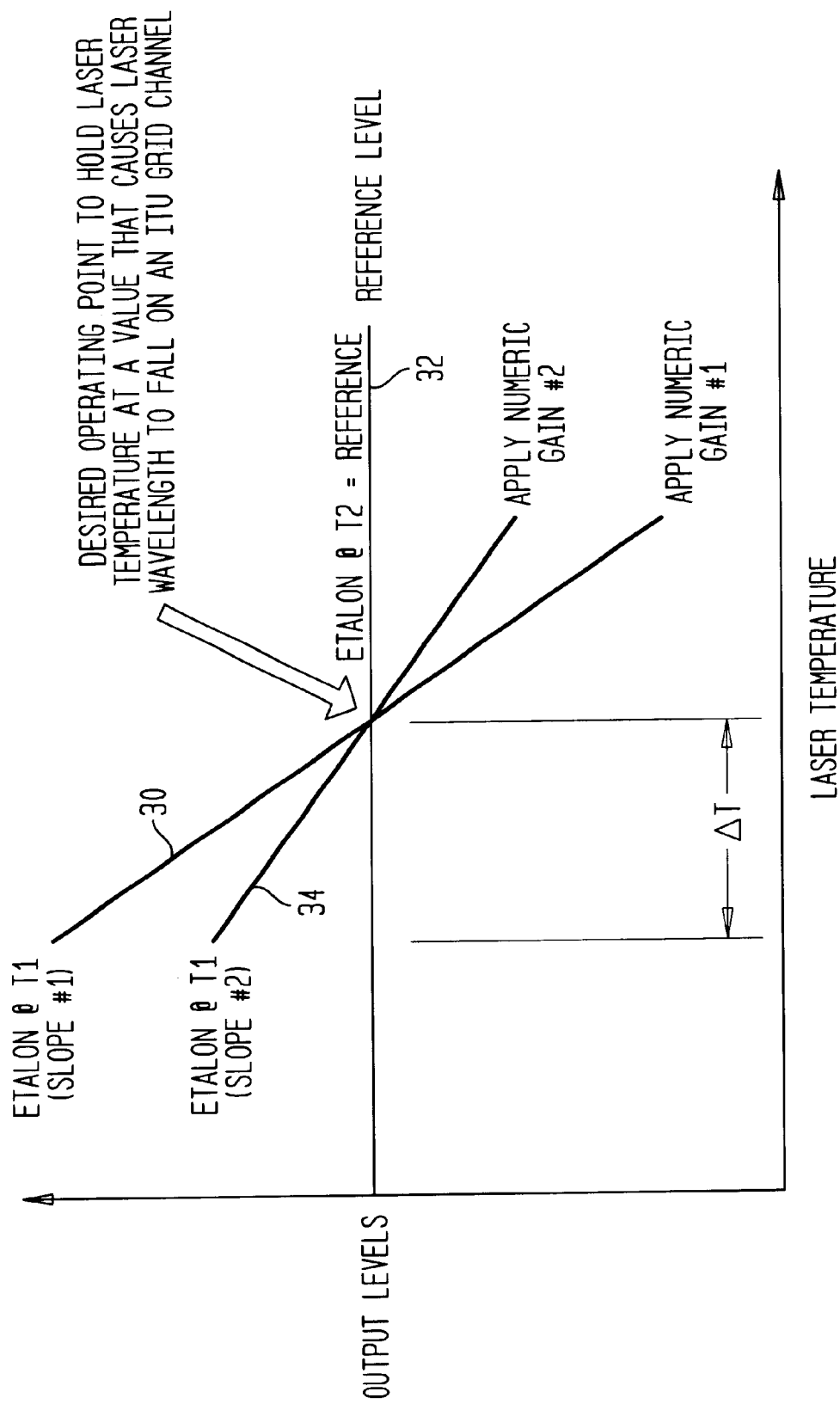
FIG. 3 illustrates exemplary etalon slopes for two etalon response curves.

FIG. 3 illustrates etalon slopes 30, 34 and a reference signal 32 in a output level versus laser temperature graph. The output level portion of the graph represents the output level of the etalon and reference optical signals, such as signals 135, 133 (FIG. 4), after they have been processed by their respective photodiode amplifier circuits 150, 152. That is, the etalon slope 30 represents the slope of etalon signal 170 and the reference signal 32 represents the reference signal 172 illustrated in FIG. 4. A second etalon slope 34 is illustrated for comparison purposes and would also correspond to the slope of etalon signal 170. It should be noted that the slope 34 represents a slope caused by a physical change in the etalon characteristics. Note that the reference signal 32 has not changed. As noted above, if the etalon did not experience a physical change, the normalized slopes 30, 34 would be the same. However, since there has been a physical change, the slopes 30, 34 are different. The upper left portion if each etalon slope 30, 34 corresponds to a first temperature T1. FIG. 3 also illustrates a desired operating point for holding the laser temperature at a value T2 corresponding to a wavelength of a desired ITU grid channel.

We must note that any given change in laser temperature produces a specific change in laser wavelength, regardless of etalon slope. Thus, it follows that if the slope of the etalon increases, a corresponding decrease in the closed-loop numeric gain must accompany this increase. Similarly, it follows that if the slope of the etalon decreases, a corresponding increase in the closed-loop numeric gain must accompany this decrease. The relationship is as follows:

$$(1)\ k*\Delta T = G*\left(\frac{ETALON-REF}{REF}\right) \text{ and}$$

$$(2)\ SLOPE = \left(\frac{ETALON-REF}{k*\Delta T}\right),$$

where $\Delta T$ represents the change in laser temperature as a direct result of the change in the TEC control signal; k is a conversion factor for correlating a change in the TEC signal per change in temperature; ETALON represents the etalon signal (after conversion to an electrical signal); REF represents the reference signal (after conversion to an electrical signal); G represents the numeric gain used in calculating the TEC control signal; and SLOPE is the slope of the etalon signal (i.e., the calculated value of change in etalon response per change in temperature and wavelength). It must be noted that typically, the TEC control signal is a voltage applied to the TEC 124 (FIG. 4). Thus, to relate the change in temperature to an equivalent change in the TEC control signal, the factor k represents a change in voltage per change in temperature (degrees C.). It should be apparent that if current, or other form of signal, is used as the TEC control signal then a different factor k may be required, but the relationships of equations (1) and (2) still apply.

The relationship between the gain and etalon slope can be determined as follows:

$$k*\Delta T = G*\left(\frac{ETALON-REF}{REF}\right) \Rightarrow k*\Delta T/G =$$

$$\left(\frac{ETALON-REF}{REF}\right) \Rightarrow (3)\ \frac{k*\Delta T*REF}{G} = ETALON-REF,$$

$$SLOPE = \left(\frac{ETALON-REF}{k*\Delta T}\right) \Rightarrow (4)\ SLOPE*k*\Delta T =$$

ETALON−REF, and $$\frac{k*\Delta T*REF}{G} = SLOPE*k*\Delta T \Rightarrow k*\Delta T*REF =$$

$$k*\Delta T*SLOPE*G \Rightarrow (5)\ G = REF/SLOPE.$$

We must also note that the TEC control signal, which is used to effectuate a change in the laser temperature can also be calculated using equation (1) for $\Delta T$. That is, the TEC control signal is calculated as follows:

$$(6)\ \text{TEC control signal} = G * \left( \frac{\text{ETALON} - \text{REF}}{\text{REF}} \right).$$

We will now use the slopes 30, 34 illustrates in FIG. 3 as an example to show why new gains are required when etalon slopes change. Etalon slope 30 has a first slope SLOPE # 1 and etalon slope 34 has a second slope SLOPE # 2 between time T2-T1.For this example, we assume that SLOPE # 1 is 1, SLOPE # 2 is 2, the reference signal 32 is 1 and ΔT is constant. According to equation (5) the gain GAIN # 1 required for the first etalon slope 30 would be ½, but the gain GAIN # 2 required for the second etalon slope 34 would be ⅙. Thus, 2 different gains GAIN # 1, GAIN # 2 would be required to obtain the desired ΔT and TEC control signal. If these different gains GAIN # 1, GAIN # 2 are not incorporated into the system, i.e., system 100 (FIG. 4), the system could experience strong oscillations of the TEC control signal about a desired wavelength locking point, wavelength drift beyond system specifications and unwanted laser wavelength mode-hopping to undesired channels.

Referring now to FIGS. 4 and 5, preferably, the method 200 of the present invention is implemented in software that is downloaded into and executed by the controller 160. It should be appreciated that the method 200 can be implemented in hardware or a combination of hardware and software. In particular, the method 200 can be implemented in an application specific integrated circuit (ASIC) or a field programmable gate array (FPGA).

The method 200 begins when the controller 160 turns on the laser module 110 bias (step 202). By turning on the bias, the laser module will be begin to transmit the laser and backface outputs 120, 122. At step 204 the controller 160 inputs via an analog-to-digital converter 128 value or reading of the thermistor 126. This measured thermistor value is used to call and access a channel look-up table and is stored for future use in an etalon slope calculation. This look-up table will have the correlation between all wavelengths, channels and temperature required to obtain these wavelengths/channels. The values in the look-up table are defined during the calibration of laser module 110 based on the response of module 110 under specific operating conditions and can be stored, for example, in a memory of controller 160.

At step 206 the controller measures the etalon signal 170 from the second photodiode amplifier circuit 152 (hereinafter referred to as the "etalon PD") via A/D converter 156. The controller also measures the reference signal 172 from the first photodiode amplifier circuit 150 (hereinafter referred to as the "reference PD") via A/D converter 154. In addition, a normalized difference value is calculated as follows:

$$(7)\ \text{normalized difference value} = \left( \frac{\text{ETALON} - \text{REF}}{\text{REF}} \right),$$

where ETALON represents the measured etalon signal and REF represents the measured reference signal. At this point, the measured etalon and reference signals and the calculated normalized difference value are stored for future use in the etalon slope calculation.

At step 208, the controller obtains the numeric gain and factory slope values from respective look-up tables. The values in the look-up table are defined during the calibration of laser module 110 based on the response of module 110 under specific operating conditions and can be stored, for example, in a memory of controller 160. In addition, a TEC control signal, which is typically a voltage, is calculated in accordance with equation (6). This TEC control signal is then output by the controller 160 to ensure that the laser module 110 has a temperature corresponding to a desired wavelength.

At step 210 the thermistor value and the etalon PD and reference PD values are re-measured. These newly measured values and the previously stored thermistor, etalon PD and reference PD values are used to calculate the current etalon slope of the system 100 in accordance with equation (2) above. Once the slope is calculated, the newly measured thermistor value and the etalon PD and reference PD values are respectively stored in place of their previous values.

At step 212 the controller 160 determines if the newly calculate etalon slope (step 210) is significantly different from the factory slope value. What is "significantly different" is system dependent and may be determine relative to the optical coating characteristics or alignment tolerances used in the final laser package, each of which could create changes in the slope of the response curve of the etalon. A significant change relative to the optical coating would be a change that is defined by reflection characteristics of the coating itself as it ages. It is important to insure that the coating actually has aged, as opposed to the possibility that a particular time slot in the control algorithm has simply detected noise which could be interpreted as aging of the film. Regardless, what is significant is defined by the coating used on the particular piece part in the package, and can easily be redefined for numerous types of coatings. Similarly, alignment tolerances in the package would define what is significant.

If at step 212 it is determined that the newly calculate etalon slope (step 210) is significantly different from the factory slope value, the method 200 continues at step 214. At step 214 a new numeric gain is calculated in accordance with equation (5) using the new etalon slope. The newly calculated slope is then stored as the factory slope. Likewise, the newly calculated gain value is stored as the factory gain value.

At step 216 a normalized difference value is calculated in accordance with equation (7). Once the normalized difference value is computed, a new TEC control signal is calculated in accordance with equation (6). This TEC control signal is then output by the controller 160 to ensure that the laser module 110 has a temperature corresponding to a desired wavelength.

At step 218 the thermistor value and the etalon PD and reference PD values are measured. These values are used to calculate a new normalized difference value in accordance with equation (7). At step 220 it is determined if the new thermistor value has significantly changed from the previous thermistor value. A change in the thermistor value will reflect a change in laser temperature, and thus a change in laser wavelength. This is used as a "sanity check" for the method 200. Laser temperature, if maintained about some nominal value, will tell the controller 160 that the laser wavelength is bounded, and thus changes in the etalon slope would indicate some physical package variation, which would justify altering the closed-loop gain to maintain steady operation. On the other hand, if a slope change is detected at the same time a change in thermistor value is detected (i.e., a corresponding change in laser wavelength) a readjustment of the closed loop gain would not be justified.

Significant changes in wavelength will drive the response curve of the etalon to a different local slope value (due to the non-linear characteristics of the response curve), and thus, a steady state wavelength would have to first be re-established before the method 200 could determine whether the etalon response curve itself has changed.

Typically, different thermistors will have different response characteristics. The characteristics are well characterized and known to be stable and predictable. "Significance" for step 220 would be defined by what type of thermistor is being used, along with what the slope of the etalon is at the time the thermistor value changes. Steeper etalon slopes will respond more strongly to changes in wavelength, and as such, less of a temperature change would constitute a greater variation in the response curve of the etalon.

If at step 220 it is determined that the new thermistor value has significantly changed from the previous thermistor value, then the method 200 continues at step 210 (described above). If at step 220 it is determined that the new thermistor value has not significantly changed from the previous thermistor value, then the method 200 continues at step 216 (described above). It should be noted that if at step 212 it is determined that the newly calculated etalon slope (step 210) is not significantly different from the factory slope value, the method 200 continues at step 216 as well.

It should be noted that steps 210 through 220 will be executed continuously. Thus, the automatic closed-loop gain adjustment of the present invention will be executed continuously. As such, the method 200 and system 100 will perform automatic closed-loop gain adjustment that continually compensates for changes in the etalon response curve slopes of the system.

The method of the present invention is implemented in software and the software instructions and data can be stored in PROM, EEPROM or other non-volatile memory connected to or contained within the controller. The software used in the present invention can be stored on a hard drive, floppy disc, CD-ROM or other permanent or semi-permanent storage medium and subsequently transferred to the memory of the controller. The program embodying the method of the present invention can also be divided into program code segments, downloaded, for example, from a server computer or transmitted as a data signal embodied in a carrier wave to the controller as is known in the art.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of controlling a laser output from a laser source in a laser based system, said method comprising the steps of:
    applying the laser output to an optical filter to obtain an optical response of the laser output;
    calculating a slope of the optical response;
    determining if the calculated slope is different than a previous slope by a predetermined amount; and
    if it is determined that the calculated slope is different than the previous slope by the predetermined amount,
    calculating a control signal based on the calculated slope, and
    tuning the laser source using the calculated control signal.

2. The method of claim 1 wherein if it is determined that the calculated slope is not different than the previous slope by the predetermined amount, said method further comprises the step of tuning the laser source using a control signal based on the previous slope.

3. The method of claim 1 wherein the optical filter is an etalon filter and the optical response is an etalon response.

4. The method of claim 1 wherein said applying step comprises:
    splitting the laser output into at least first and second outputs; and
    applying the first output to the optical filter to obtain the optical response.

5. The method of claim 4 wherein said step of calculating the slope of the optical response comprises:
    obtaining a change in temperature of the laser source;
    converting the optical response into a first electrical signal;
    converting the second output into a second electrical signal; and
    calculating the slope based upon the change in temperature and the first and second electrical signals.

6. The method of claim 5 wherein said step of calculating a control signal based on the calculated slope comprises:
    determining a gain associated with the calculated slope;
    determining a normalized difference value of the optical response; and
    multiplying the gain by the normalized difference value of the optical response.

7. The method of claim 6 wherein said step of determining the gain comprises dividing the second electrical signal by the calculated slope.

8. The method of claim 6 wherein said step of determining the normalized difference value of the optical response comprises:
    taking a difference between the first and second electrical signals and normalizing the difference by the second electrical signal.

9. The method of claim 8 wherein the first electrical signal is an etalon electrical signal and the second electrical signal is a reference signal.

10. The method of claim 1 wherein if it is determined that the calculated slope is different than the previous slope by the predetermined amount, said method stores said calculated slope as a new previous slope and repeats said applying step to said determining step to determine if another control signal should be calculated.

11. The method of claim 1 wherein the laser source is a temperature tunable laser source and the control signal is a voltage corresponding to a temperature of a desired wavelength of the laser output.

12. The method of claim 1 wherein said step of calculating a control signal based on the calculated slope comprises:
    determining a gain associated with the calculated slope;
    determining a normalized difference value of the optical response; and
    multiplying the gain by the normalized difference value of the optical response.

13. A method of controlling a laser output from a temperature tunable laser source in a laser based system, said method comprising the steps of:
    applying the laser output to an etalon filter to obtain an etalon response of the laser output;

calculating a slope of the etalon response;

determining if the calculated slope is different than a previous slope; and if it is determined that the calculated slope is different than the previous slope, calculating a control signal based on the calculated slope and a system gain associated with the calculated slope, and changing a temperature of the laser source using the calculated control signal.

14. The method of claim 13 wherein if it is determined that the calculated slope is not different than the previous slope, said method further comprises maintaining the temperature of the laser source using a control signal based on the previous slope and a gain associated with the previous slope.

15. The method of claim 13 wherein said applying step comprises:

splitting the laser output into at least first and second outputs; and applying the first output to the etalon filter to obtain the etalon response.

16. The method of claim 15 wherein said step of calculating the slope of the etalon response comprises:

obtaining a change in temperature of the laser source;

converting the etalon response into an etalon electrical signal;

converting the second output into a reference electrical signal; and calculating the slope based upon the change in temperature and the etalon electrical signal and the reference electrical signal.

17. The method of claim 16 wherein said step of calculating a control signal based on the calculated slope comprises:

determining a gain associated with the calculated slope;

determining a normalized difference value of the etalon response; and multiplying the gain by the normalized difference value of the etalon response.

18. The method of claim 17 wherein said step of determining the gain associated with the calculated slope comprises dividing the reference electrical signal by the calculated slope.

19. The method of claim 17 wherein said step of determining the normalized difference value of the etalon response comprises:

taking a difference between the etalon and reference electrical signals and normalizing the difference by the reference electrical signal.

20. The method of claim 13 wherein if it is determined that the calculated slope is different than the previous slope, said method stores said calculated slope as a new previous slope and repeats said applying step to said determining step to determine if another control signal should be calculated.

21. The method of claim 13 wherein the control signal is a voltage corresponding to a temperature of a desired wavelength of the laser output.

22. The method of claim 13 wherein said step of calculating a control signal based on the calculated slope and gain associated with the calculated slope comprises:

determining a gain associated with the calculated slope;

determining a normalized difference value of the etalon response; and multiplying the gain by the normalized difference value of the etalon response.

23. A laser system comprising:

a laser source having a laser output;

an optical filter coupled to said laser output for generating an optical response from said laser output; and a controller coupled to said laser source and said filter, said controller comprising:

means for calculating a slope of said optical response, means for determining if said calculated slope is different than a previous slope by a predetermined amount, means for calculating a control signal based on said calculated slope if said controller determines that said calculated slope is different than the previous slope by the predetermined amount, and means for tuning said laser source using said calculated control signal.

24. The system of claim 23 wherein if said controller determines that said calculated slope is not different than the previous slope by the predetermined amount, said controller tunes said laser source using a control signal based on said previous slope.

25. The system of claim 23 wherein said optical filter is an etalon filter and said optical response is an etalon response.

26. The system of claim 23 further comprising:

splitter circuitry coupled to said laser output for splitting said laser output into at least first and second outputs, wherein said first output is applied to said optical filter to obtain said optical response.

27. The system of claim 26 further comprising:

a temperature reading device coupled to said laser source;

a first conversion circuit coupled to said optical response, said circuit first conversion circuit converting said optical response into a first electrical signal;

a second conversion circuit coupled to said second output, said second conversion circuit converting said second output into a second electrical signal;

wherein said controller is coupled to said temperature device and said first and second electrical signals, and wherein said controller calculates said slope of said optical response by obtaining a change in temperature of said laser source from said temperature device and calculates said slope based upon said change in temperature and the first and second electrical signals.

28. The system of claim 27 wherein said controller calculates said control signal based on said calculated slope by determining a gain associated with said calculated slope, determining a normalized difference value of said optical response, and multiplying said gain by said normalized difference value of said optical response.

29. The system of claim 28 wherein said controller determines said gain by dividing said second electrical signal by said calculated slope.

30. The system of claim 28 wherein said controller determines said normalized difference value of said optical response by taking a difference between said first and second electrical signals and normalizing said difference by said second electrical signal.

31. The system of claim 27 wherein said first electrical signal is an etalon electrical signal and said second electrical signal is a reference signal.

32. The system of claim 23 wherein said laser source is a temperature tunable laser source and said control signal is a voltage corresponding to a temperature of a desired wavelength of said laser output.

33. The system of claim 23 wherein said controller calculates said control signal based on said calculated slope by determining a gain associated with said calculated slope, determining a normalized difference value of said optical response, and multiplying said gain by said normalized difference value of said optical response.

34. The system of claim 23 wherein said controller is a programmed processor.

35. The system of claim 23 wherein said controller is a application specific integrated circuit.

36. A laser based system comprising:
   a laser source having a laser output, said laser source being temperature tunable;
   an etalon filter coupled to said laser output and generating an etalon response from said laser output; and
   a controller coupled to said laser source and said filter, said controller comprising:
      means for calculating a slope of said etalon response, means for determining if said calculated slope is different than a previous slope, means for calculating a control signal based on said calculated slope and a gain associated with said calculated slope if said controller determines that said calculated slope is different than a previous slope, and means for changing a temperature of said laser source using said calculated control signal.

37. The system of claim 36 wherein if said controller determines that said calculated slope is not different than said previous slope, said controller maintains the temperature of said laser source using a control signal based on said previous slope and a gain associated with said previous slope.

38. The system of claim 36 further comprising:
   splitter circuitry coupled to said laser output for splitting said laser output into at least first and second outputs, wherein said first output is applied to said etalon filter to obtain said etalon response.

39. The system of claim 38 further comprising:
   a temperature reading device coupled to said laser source;
   a first conversion circuit coupled to said etalon response, said circuit first conversion circuit converting said etalon response into an etalon electrical signal;
   a second conversion circuit coupled to said second output, said second conversion circuit converting said second output into a reference electrical signal; and
   wherein said controller is coupled to said temperature device and said etalon and reference electrical signals, and wherein said controller calculates said slope by obtaining a change in temperature of said laser source and calculating said slope based upon said change in temperature, and said etalon and reference electrical signals.

40. The system of claim 39 wherein said controller calculates said control signal based on said calculated slope by determining a gain associated with said calculated slope, determining a normalized difference value of said etalon response, and multiplying said gain by said normalized difference value of said etalon response.

41. The system of claim 40 wherein said controller determines said gain associated with said calculated slope by dividing said reference electrical signal by said calculated slope.

42. The system of claim 40 wherein said controller determines said normalized difference value of said etalon response by taking a difference between said etalon and reference electrical signals and normalizing said difference by said reference electrical signal.

43. The system of claim 36 wherein said control signal is a voltage corresponding to a temperature of a desired wavelength of said laser output.

44. The system of claim 36 wherein said controller calculates said control signal based on said calculated slope and gain associated with said calculated slope by determining a gain associated with said calculated slope, determining a normalized difference value of said etalon response, and multiplying said gain by said normalized difference value of said etalon response.

45. The system of claim 36 wherein said controller is a programmed processor.

46. The system of claim 36 wherein said controller is a application specific integrated circuit.

* * * * *